(12) United States Patent
Kuang

(10) Patent No.: US 9,116,188 B2
(45) Date of Patent: Aug. 25, 2015

(54) CAPACITANCE EVALUATION CIRCUIT AND ELECTRONIC DEVICE USING THE SAME

(75) Inventor: Yu Kuang, Hsinchu (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 940 days.

(21) Appl. No.: 13/305,343

(22) Filed: Nov. 28, 2011

(65) Prior Publication Data

US 2012/0068724 A1    Mar. 22, 2012

Related U.S. Application Data

(62) Division of application No. 12/502,247, filed on Jul. 14, 2009, now Pat. No. 8,209,139.

(30) Foreign Application Priority Data

Aug. 18, 2008  (TW) .............................. 97131473 A

(51) Int. Cl.
   G01R 27/26    (2006.01)
   H03K 17/955   (2006.01)
   H03K 17/96    (2006.01)

(52) U.S. Cl.
   CPC .......... *G01R 27/2605* (2013.01); *H03K 17/955* (2013.01); *H03K 17/962* (2013.01); *H03K 2217/960725* (2013.01)

(58) Field of Classification Search
   CPC .................... H03K 17/962; H03K 2217/9607; G01R 27/2605
   IPC ........ H03K 17/962, 2217/9607; G01R 27/2605
   See application file for complete search history.

(56) References Cited

U.S. PATENT DOCUMENTS

| 6,002,220 A | * | 12/1999 | Takahashi et al. | ............ 318/139 |
| 6,466,036 B1 | | 10/2002 | Philipp | |
| 2006/0284603 A1 | | 12/2006 | Nehrig et al. | |
| 2007/0296709 A1 | * | 12/2007 | GuangHai | ...................... 345/173 |
| 2012/0092030 A1 | * | 4/2012 | Roth | .............................. 324/679 |

FOREIGN PATENT DOCUMENTS

TW          200402649          2/2004

OTHER PUBLICATIONS

Taiwanese language office action dated Jun. 27, 2012.
English language translation of abstract of TW 200402649 (published Feb. 16, 2004).

* cited by examiner

*Primary Examiner* — Mischita Henson

(57) ABSTRACT

A capacitance evaluation circuit includes a capacitive voltage divider, an analog-to-digital converter (ADC) and a processing module. The capacitive voltage divider includes a switch circuit, a known capacitor and a capacitor under test. The switch circuit is controlled by first and second clock signals. A voltage variation at a first terminal of the known capacitor is coupled to a first terminal of the capacitor under test based on a conduction state of the switch circuit. The ADC converts a voltage on the first terminal of the capacitor under test into a digital signal. The processing module detects a capacitance and a capacitance variation of the capacitor under test according to the digital signal from the ADC and a parameter of the ADC.

2 Claims, 4 Drawing Sheets

CAPACITANCE EVALUATION CIRCUIT AND ELECTRONIC DEVICE USING THE SAME

This application is a divisional application of application Ser. No. 12/502,247, filed on Jul. 14, 2009, which claims the benefit of Taiwan application Serial No. 97131473, filed Aug. 18, 2008, the contents of which are incorporated herein by reference.

FIELD OF THE DISCLOSURE

The disclosure relates in general to a capacitance evaluation circuit for evaluating a capacitance of a capacitor under test, and an electronic device using the same.

BACKGROUND

Conventionally, a mechanical switch is frequently provided to implement a user control interface device. Because the conventional mechanical switch needs to be in direct contact with the user so as to operate in response to the user's control command, the conventional mechanical device tends to have the structural damage during the user's operation process. At present, a touch switch, such as a capacitive switch, is developed.

In order to enhance the convenience in use, a touch panel or a display touch panel capable of displaying information and being touched has been developed. The touch panel or the display touch panel can receive the input operation and the click operation of the user. The touch panel or the display touch panel may be applied to various electronic devices, such as mobile phones. Thus, the user can directly click a frame on the touch panel or the display touch panel to perform the operation so that the more convenient and more human-oriented operation modes can be provided. There are many types of touch panels or display touch panels, and the capacitive touch panel or the capacitive display touch panel is one of them.

When the user operates the capacitive touch panel, the capacitive display touch panel or the capacitive switch, the capacitance of the capacitor under test therein is changed due to the user's operation. Thus, the user's operation can be detected. However, it is an important subject to design a capacitance evaluation circuit capable of effectively detecting the capacitance variation of the capacitor under test and thus to enhance the performance of the capacitive touch panel, the capacitive display touch panel or the capacitive switch.

SUMMARY OF THE DISCLOSURE

The disclosure is directed to a capacitance evaluation circuit. Compared with the conventional capacitance evaluation circuit, the capacitance evaluation circuit of the disclosure can evaluate a capacitance and a capacitance variation of a capacitor under test more precisely.

The disclosure is also directed to an electronic device including a touch screen and a sensor, which share the same analog-to-digital converter (ADC) so that the circuit area and the cost of the electronic device can be reduced.

An example of the present disclosure provides an electronic device including: a capacitor under test, outputting a voltage under test; a sensor, outputting a sensing signal; a multiplexer, coupled to the capacitor under test and the sensor, outputting one of the voltage under test and the sensing signal; and an analog-to-digital converter (ADC), coupled to the multiplexer, converting one of the voltage under test and the sensing signal into a digital output signal, which represents one of a capacitance of the capacitor under test and a capacitance variation of the capacitor under test, and a sensed result of the sensor.

The disclosure will become apparent from the following detailed description of the preferred but non-limiting embodiments. The following description is made with reference to the accompanying drawings.

DETAILED DESCRIPTION OF THE DISCLOSURE

The capacitance evaluation circuit according to embodiments of the disclosure may be used to evaluate a capacitance of a capacitor under test and to convert the capacitance into a digital output signal. Thus, it is possible to detect whether the capacitance of the capacitor under test is changed. In addition, in an electronic device according to a further embodiment of the disclosure, a touch screen and a sensor therein can share the same analog-to-digital converter (ADC) so that the circuit area and the cost of the electronic device can be decreased.

First Embodiment

Figure 1:
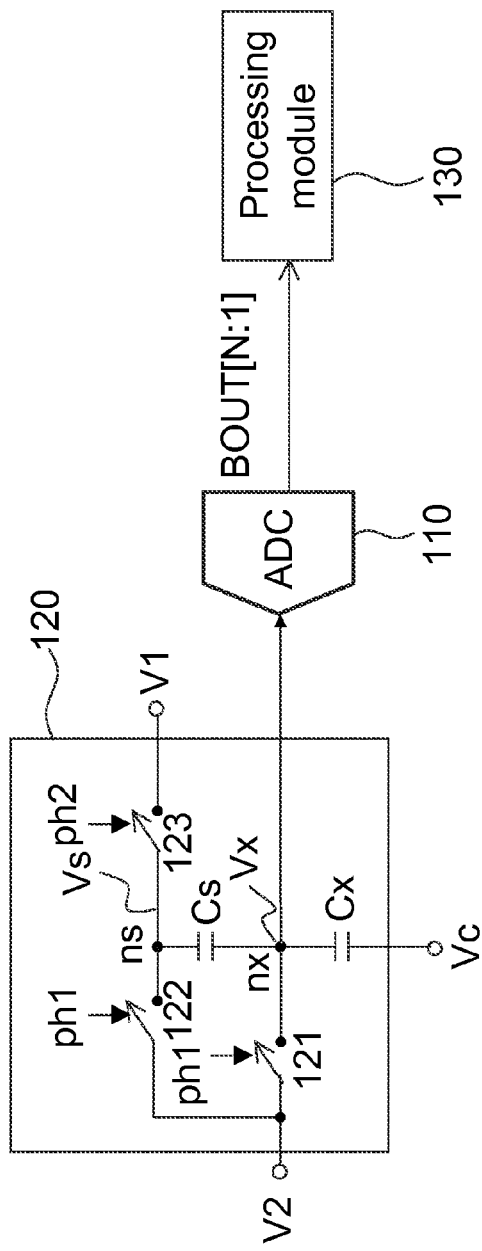
FIG. 1 is a schematic illustration showing a capacitance evaluation circuit according to a first embodiment of the disclosure.
Figure 2:
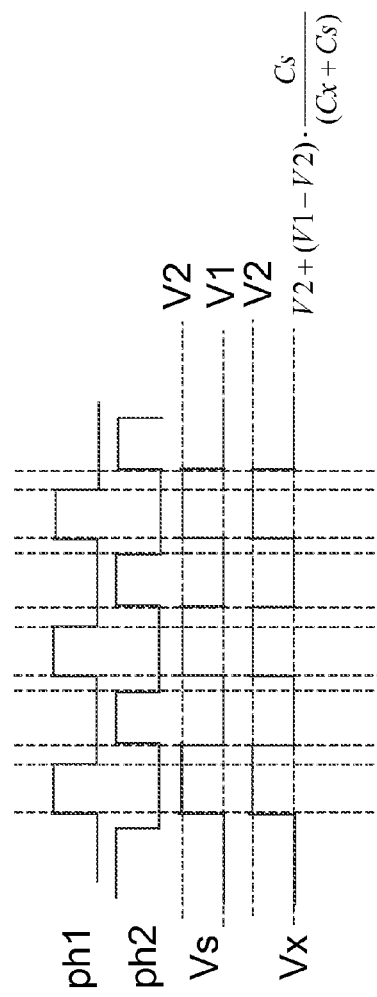
FIG. 2 shows associated waveforms of FIG. 1.

FIG. 1 is a schematic illustration showing a capacitance evaluation circuit according to a first embodiment of the disclosure. FIG. 2 shows associated waveforms of FIG. 1.

Referring to FIG. 1, the capacitance evaluation circuit includes an ADC 110, a capacitive voltage divider 120 and a processing module 130. The ADC 110 has, for example, a sigma-delta ADC with a sample-hold (S/H) function. The capacitive voltage divider 120 includes switches 121 to 123, and capacitors Cs and Cx. In this embodiment, V1, V2 and Vc are voltage sources. It is assumed that V1<V2, and a clock signal ph1 is an inverse of a clock signal ph2.

The switch 121 has one terminal coupled to the voltage source V2, and the other terminal coupled to a node nx. The voltage of the node nx is Vx. The conduction state of the switch 121 is controlled by the clock signal ph1. For example, the switch 121 is turned on when the clock signal ph1 has the high potential; and vice versa. When the switch 121 is turned on, the node voltage Vx is equal to V2.

The switch 122 has one terminal coupled to the voltage source V2, and the other terminal coupled to a node ns. The voltage of the node ns is Vs. The conduction state of the switch 122 is controlled by the clock signal ph1. For example, the switch 122 is turned on when the clock signal ph1 has the high potential; and vice versa. When the switch 122 is turned on, the node voltage Vs is equal to V2.

The switch 123 has one terminal coupled to the voltage source V1, and the other terminal coupled to the node ns. The conduction state of the switch 123 is controlled by the clock signal ph2. For example, the switch 123 is turned on when the clock signal ph2 has the high potential; and vice versa. When the switch 123 is turned on, the node voltage Vs is equal to V1.

The capacitor Cs is coupled to and between the nodes ns and nx. The capacitance of the capacitor Cs is known. The capacitor Cx is coupled to and between the node nx and the voltage source Vc. The capacitance of the capacitor Cx is unknown. The capacitance evaluation circuit may be adopted to evaluate the capacitance of the capacitor Cx.

The operation of the capacitance evaluation circuit according to the first embodiment of the disclosure will be described with reference to FIGS. 1 and 2.

When the clock signal ph1 has the high potential (i.e., the clock signal ph2 has the low potential), the switches 121 and 122 are turned on so that the node voltages Vx and Vs are equal to V2.

When the clock signal ph1 is transited from the high potential to the low potential (i.e., the clock signal ph2 is changed from the low potential to the high potential), the switch 123 is turned on such that the node voltage Vs is equal to V1. Consequently, the voltage variation of one terminal of the capacitor Cs (i.e., the node voltage Vs) is equal to (V1−V2). The voltage variation (V1−V2) is coupled to a node nx through the capacitor Cs so that the node voltage Vx is changed. The voltage variation of the node voltage Vx may be represented by Equation (1):

$$(V1-V2)\cdot\frac{Cs}{(Cs+Cx)} \quad (1)$$

At an instant before the clock signal ph1 is transited, the node voltage Vx is V2. At an instant after the clock signal ph1 is transited, the node voltage Vx is represented by Equation (2):

$$Vx = V2 + (V1-V2)\cdot\frac{Cs}{(Cs+Cx)} \quad (2)$$

The node voltage Vx sampled and held by the ADC 110 is converted into a digital output value BOUT[N:1]. The decimal value of the digital output value BOUT[N:1] is represented as DOUT.

The processing module 130 can calculate the capacitance and its variation of the capacitor Cx according to DOUT, the capacitance of the capacitor Cs, V1, V2, and the full scale and the resolution of the ADC 110.

For instance, if the full scale of the ADC 110 is from V2 to V1 and its resolution is equal to n bits (n is a positive integer), then Cx, V1, V2, Cs, DOUT and n have the following relationship represented by Equation (3):

$$V2 + (V1-V2)\cdot\frac{Cs}{(Cs+Cx)} \cong \frac{DOUT}{2^n}\cdot(V2-V1) \quad (3)$$

Equation (3) is simplified and Cx is represented by Equation (4):

$$Cx \cong \frac{\frac{DOUT}{2^n}(V1-V2)+V1}{-V2-\frac{DOUT}{2^n}(V1-V2)}\cdot Cs \quad (4)$$

Thus, the capacitance of the capacitor Cx can be obtained.

The capacitance evaluation circuit according to the first embodiment can be applied to a capacitive switch, a capacitive touch panel, a capacitive display touch panel or the like. When the user is operating the capacitive switch, the capacitance of its internal capacitor Cx under test is changed as the user's operation changes. By evaluating the capacitance and the capacitance variation of the capacitor Cx through the capacitance evaluation circuit, whether the user has pressed down the capacitive switch is detected. In addition, when the user operates the capacitive touch panel or the capacitive display touch panel, the capacitance of its internal capacitor Cx under test is changed when the user presses down the panel. By evaluating the capacitance and the capacitance variation of the capacitor Cx through the capacitance evaluation circuit, the position pressed by the user is known.

Second Embodiment

Figure 3:
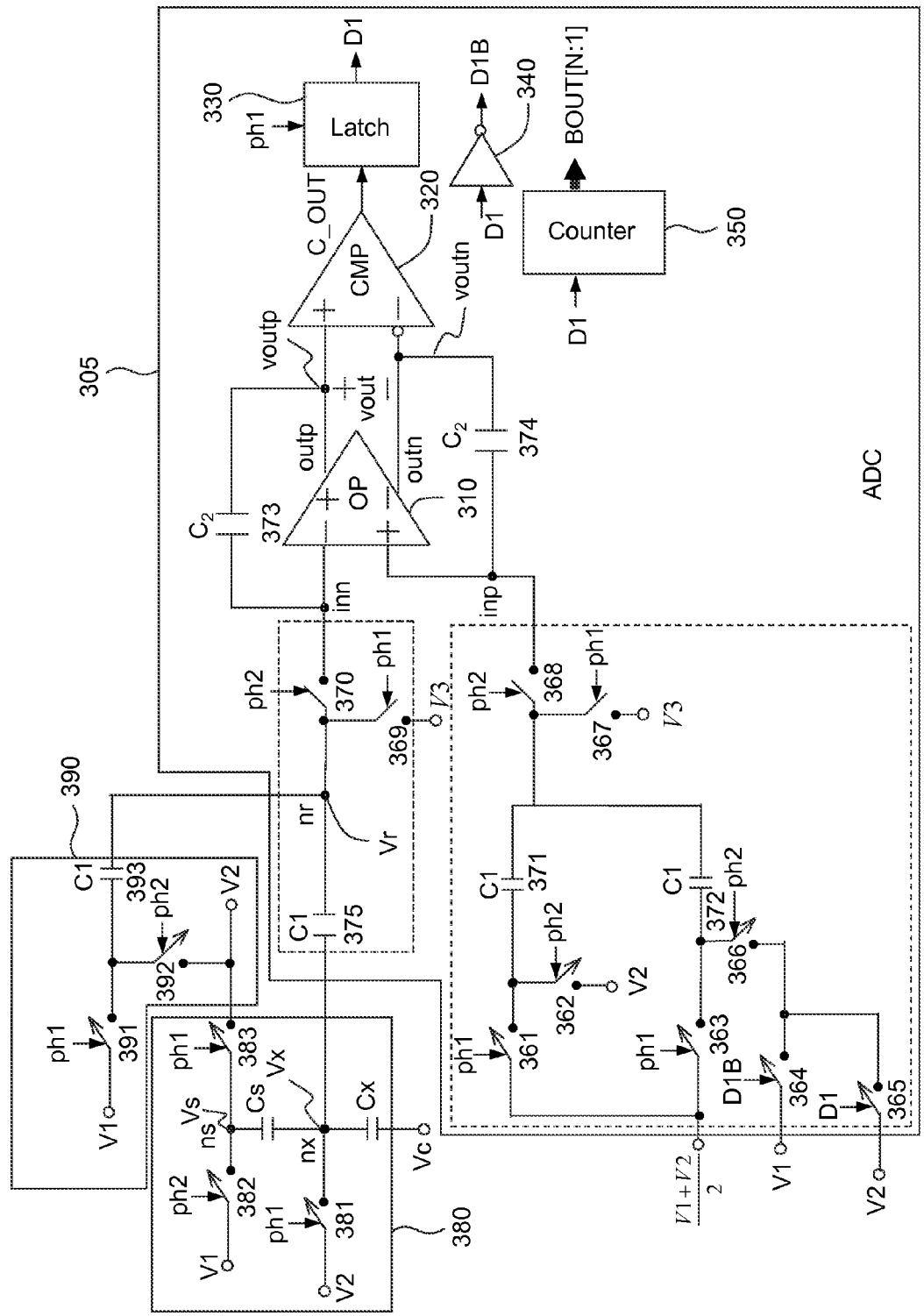
FIG. 3 is a schematic illustration showing a capacitance evaluation circuit according to a second embodiment of the disclosure.
Figure 4:
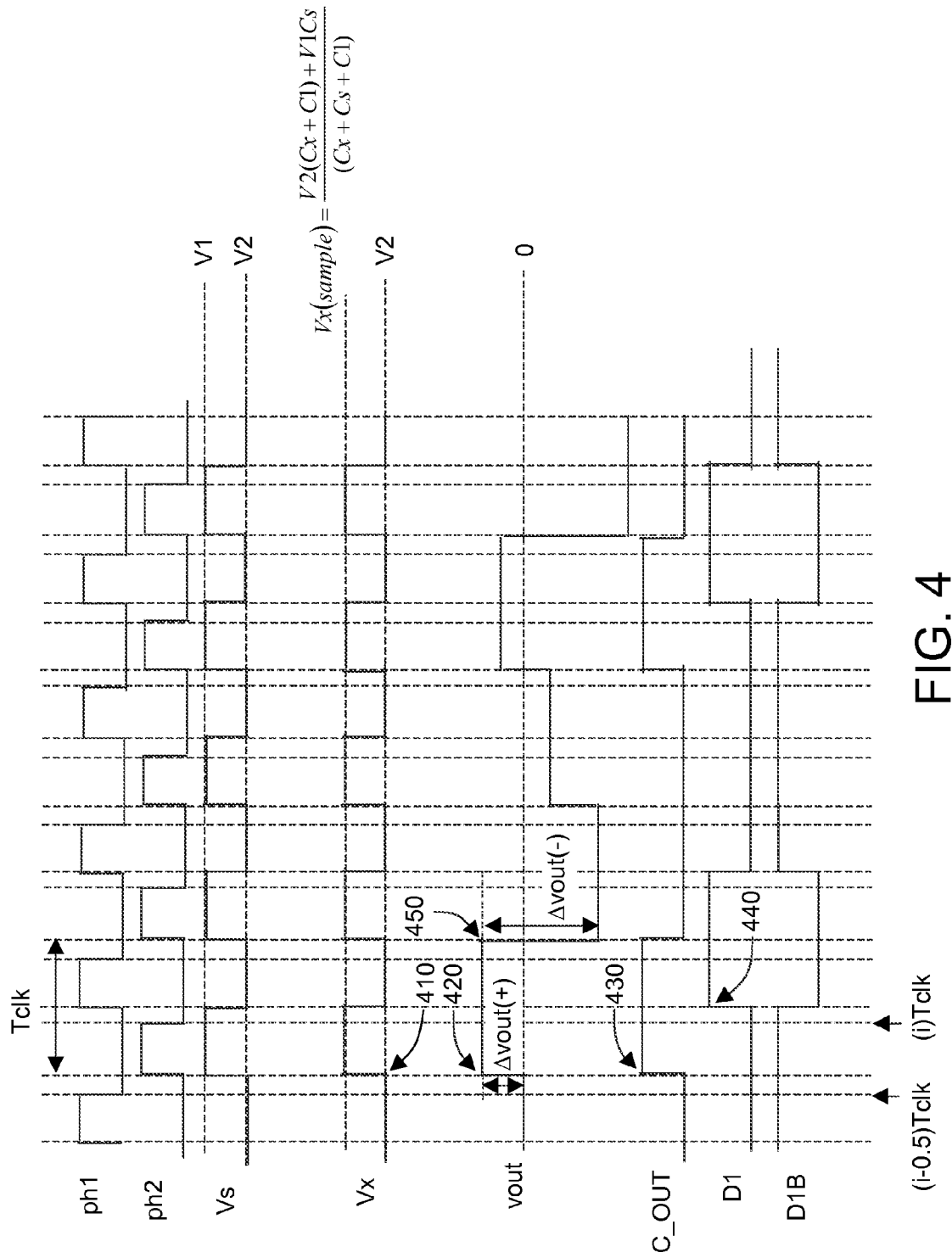
FIG. 4 shows associated waveforms of FIG. 3.

FIG. 3 is a schematic illustration showing a capacitance evaluation circuit according to a second embodiment of the disclosure. FIG. 4 shows associated waveforms of FIG. 3.

As shown in FIG. 3, the capacitance evaluation circuit includes an ADC 305, a capacitive voltage divider 380 and a bias circuit 390. For example, the ADC 305 is a sigma-delta ADC having the sample-hold (S/H) function.

The ADC 305 includes an operation amplifier (OP) 310, a comparator (CMP) 320, a latch 330, an inverter 340, a counter 350, switches 361 to 370 and capacitors 371 to 375.

The operation amplifier 310 has a positive input terminal inp coupled to the switch 368 and the capacitor 374; a negative input terminal inn coupled to the switch 370 and the capacitor 373; a positive output terminal outp coupled to a positive input terminal of the comparator 320 and the capacitor 373; and a negative output terminal outn coupled to a negative input terminal of the comparator 320 and the capacitor 374.

The comparator 320 has a positive input terminal coupled to the positive output terminal outp of the operation amplifier 310; a negative input terminal coupled to the negative output terminal outn of the operation amplifier 310; and an output terminal coupled to the latch 330. An output signal C_OUT of the comparator 320 is inputted to the latch 330.

The latch 330 receives the output signal C_OUT of the comparator 320 to output a digital signal D1. The latch 330 is controlled by the clock signal ph1.

The inverter 340 inverts the digital signal D1 into another digital signal D1B, which is an inverse to the digital signal D1.

The counter 350 counts the digital signal D1 to generate a count result BOUT[N:1].

The switch 361 has one terminal coupled to a voltage source (V1+V2)/2, and the other terminal coupled to the capacitor 371 and the switch 362. The conduction state of the switch 361 is controlled by the clock signal ph1.

The switch 362 has one terminal coupled to the voltage source V2, and the other terminal coupled to the capacitor 371 and the switch 361. The conduction state of the switch 362 is controlled by the clock signal ph2.

The switch 363 has one terminal coupled to the voltage source (V1+V2)/2, and the other terminal coupled to the capacitor 372 and the switch 366. The conduction state of the switch 363 is controlled by the clock signal ph1.

The switch 364 has one terminal coupled to the voltage source V1, and the other terminal coupled to the switches 365 and 366. The conduction state of the switch 364 is controlled by the digital signal D1B.

The switch 365 has one terminal coupled to the voltage source V2, and the other terminal coupled to the switches 364 and 366. The conduction state of the switch 365 is controlled by the digital signal D1.

The switch 366 has one terminal coupled to the capacitor 372 and the switch 363, and the other terminal coupled to the switches 364 and 365. The conduction state of the switch 366 is controlled by the clock signal ph2. The switches 364 to 366 are adopted to transfer one of the voltage sources V1 and V2 to the capacitor 372.

The switch 367 has one terminal coupled to the voltage source V3, and the other terminal coupled to the switch 368 and the capacitors 371 and 372. The conduction state of the switch 367 is controlled by the clock signal ph1.

The switch 368 has one terminal coupled to the switch 367 and the capacitors 371 and 372, and the other terminal coupled to the positive input terminal inp of the operation amplifier 310 and the capacitor 374. The conduction state of the switch 368 is controlled by the clock signal ph2. In addition, the switches 361 to 368 and the capacitors 371 and 372 may also be referred to as a switch-capacitor circuit coupled to the input terminal inp of the operation amplifier 310. The switch-capacitor circuit is controlled by the clock signal ph1, the clock signal ph2 and the digital signals D1 and D1B.

The switch 369 has one terminal coupled to the voltage source V3, and the other terminal coupled to a node nr. The conduction state of the switch 369 is controlled by the clock signal ph1.

The switch 370 has one terminal coupled to the node nr, and the other terminal coupled to the negative input terminal inn of the operation amplifier 310 and the capacitor 373. The conduction state of the switch 370 is controlled by the clock signal ph2.

The capacitor 371 has one terminal coupled to the switches 361 and 362, and the other terminal coupled to the switches 367 and 368 and the capacitor 372.

The capacitor 372 has one terminal coupled to the switches 363 and 366, and the other terminal coupled to the switches 367 and 368 and the capacitor 371.

The capacitor 373 is coupled to and between the negative input terminal inn and the positive output terminal outp of the operation amplifier 310 to serve as a feedback circuit.

The capacitor 374 is coupled to and between the positive input terminal inp and the negative output terminal outn of the operation amplifier 310 to serve as a feedback circuit.

The capacitor 375 has one terminal coupled to the node nx, and the other terminal coupled to the switches 369 and 370.

Each of the capacitors 371, 372 and 375 has the capacitance of C1; and each of the capacitors 373 and 374 has the capacitance of C2.

In addition, the capacitor 375 and the switches 369 and 370 may also be referred to as a switch-sample-capacitor circuit, which has an input terminal coupled to one terminal nx of the capacitor Cs of the capacitive voltage divider 380, and an output terminal coupled to the input terminal inn of the operation amplifier. The switch-sample-capacitor circuit is controlled by the clock signals ph1 and ph2 to sample the terminal voltage Vx of the capacitor Cx.

The capacitive voltage divider 380 includes switches 381 to 383 and capacitors Cs and Cx. The capacitive voltage divider 380 is the same as or similar to the capacitive voltage divider 120 of the first embodiment, so detailed descriptions thereof will be omitted.

The bias circuit 390 generates a charge variation (V2−V1)*C1 and the charge variation is coupled to the node nr. That is, the capacitive voltage divider 380 and the bias circuit 390 couple the charge variation (Vx−V1)C1 to the node nr after one complete clock cycle time. The bias circuit 390 includes switches 391 and 392 and a capacitor 393. The capacitor 393 has the capacitance of C1.

The switch 391 has one terminal coupled to the voltage source V1, and the other terminal coupled to the capacitor 393. The conduction state of the switch 391 is controlled by the clock signal ph1.

The switch 392 has one terminal coupled to the voltage source V2, and the other terminal coupled to the capacitor 393. The conduction state of the switch 392 is controlled by the clock signal ph2.

The capacitor 393 has one terminal coupled to the switches 391 and 392, and the other terminal coupled to a node voltage Vr.

The operation of the capacitance evaluation circuit according to the second embodiment of the disclosure will be described with reference to FIGS. 3 and 4.

In this embodiment, the switching of the switch causes the variation of the voltage Vx. The voltage Vx is inputted to the ADC 305 so that a digital value BOUT[N:1] is obtained. Thus, the capacitance of the capacitor Cx under test can be obtained.

How to obtain the voltage value Vx inputted to the ADC 305 will be described in the following.

The charges at the node nx should be kept unchanged before and after the clock signal ph1 is transited (i.e., before or after the clock signal ph2 is transited). So, the charges at the node nx satisfy Equation (5):

$$(V2-V3)C1+(V2-V2)Cs+(V2-Vc)Cx=(Vx(\text{sample})-V3)C1+(Vx(\text{sample})-V1)Cs+(Vx(\text{sample})-Vc)Cx \quad (5)$$

In Equation (5), the left portion represents the charges at the node nx before the clock signal ph1 is transited, while the right portion represents the charges at the node nx after the clock signal ph1 is transited, wherein, Vx(sample) represents the voltage Vx when the clock signal ph2 is enabled. That is, when the clock signal ph2 is enabled, the ADC 305 samples and holds the voltage Vx to obtain the voltage Vx(sample) in this embodiment, wherein Vx(sample) is represented by Equation (6):

$$Vx(\text{sample}) = \frac{V2(Cx+C1)+V1Cs}{Cx+Cs+C1} \quad (6)$$

When the output signal C_OUT of the comparator 320 is 0, the digital signal D1 is disabled (low potential), and the digital signal D1B is enabled (high potential). When the output signal C_OUT of the comparator 320 is 0, the charges at the input terminal inn of the operation amplifier 310 should be kept unchanged before and after the clock signal ph1 is transited (i.e., before or after the clock signal ph2 is transited). So, the charges at the input terminal inn may be represented by Equation (7):

$$[V3-voutp((i-0.5))]C2+(V3-V1)C1+(V3-V2)C1 = [V3-voutp(i)]C2+(V3-V2)C1+[V3-Vx(\text{sample})]C1 \quad (7)$$

wherein voutp(i-0.5) and voutp(i) respectively represent the node voltages voutp at the $(i-0.5)^{th}$ clock and the $i^{th}$ clock.

Similarly, when the output signal C_OUT of the comparator 320 is 0, the charges at the input terminal inp of the operation amplifier 310 should be kept unchanged before and after the clock signal ph1 is transited (i.e., before and after the clock signal ph2 is transited). So, the charges at the input terminal inp may be represented by Equation (8):

$$[V3 - voutn((i-0.5))]C2 + \left[V3 - \frac{(V1+V2)}{2}\right]C1 + \left[V3 - \frac{(V1+V2)}{2}\right] \quad (8)$$
$$C1 = [V3 - voutn(i)]C2 + (V3 - V2)C1 + (V3 - V1)C1$$

wherein voutn(i-0.5) and voutn(i) respectively represent the node voltages voutn at the $(i-0.5)^{th}$ clock and the $i^{th}$ clock.

Equation (7) minus Equation (8) can obtain Equation (9):

$$\{[voutp(i) - voutn(i)] - [voutp((i-0.5)) - voutn((i-0.5))]\} = \quad (9)$$
$$\frac{(V1 - Vx(\text{sample}))C1}{C2}$$

Because the differential output voltage vout of the operation amplifier 310 is the difference between the positive output voltage voutp and the negative output voltage voutn, Equation (9) may be rewritten as Equation (10):

$$\Delta vout(+) = [vout(i) - vout((i-0.5))] = \frac{(V1 - Vx(\text{sample}))C1}{C2} \quad (10)$$

wherein $\Delta vout(+)$ represents the voltage variation of the output voltage vout of the operation amplifier 310 when D1=0. According to Equation (10), it is obtained that $\Delta vout(+)$ is a positive value (because V1>Vx(sample)). That is, the output voltage vout becomes higher when D1=0.

Similarly, it is possible to derive the voltage variation $\Delta vout(-)$ of the output voltage vout of the operation amplifier 310 as Equation (11) when D1=1:

$$\Delta vout(-) = \frac{(V2 - Vx(\text{sample}))C1}{C2} \quad (11)$$

According to Equation (11), it is obtained that $\Delta vout(-)$ is a negative value (because V2<Vx(sample)). That is, the output voltage vout becomes lower when D1=1.

In k clock cycles (k is a positive integer), if the number of clock cycles of the digital signal D1 being 1 is equal to m, and the number of clock cycles of the digital signal D1 being 0 is equal to n (m+n=k, m and n are positive integers), then the differential output voltage vout of the operation amplifier 310 may be represented as Equation (12):

$$vout(k) = n \cdot \Delta vout(+) + m \cdot \Delta vout(-) + vout(0) \quad (12)$$

At this time, the differential output voltage vout(k) of the operation amplifier 310 may also be represented as the original voltage vout(0) plus a difference voltage verr, as shown in Equation (13):

$$vout(k) = vout(0) + verr \quad (13)$$

Substitute Equations (10) and (11) into Equation (12) to solve Equations (12) and (13) can obtain:

$$Vx(\text{sample}) = \frac{nV1 + mV2}{n+m} + \frac{verrC2}{(m+n)C1} \quad (14)$$

If $$\frac{(m+n)C1}{C2} \gg verr,$$

Vx(sample) may approximate to:

$$Vx(\text{sample}) \cong \frac{nV1 + mV2}{n+m} \quad (15)$$

Substitute Equation (6) into Equation (15) can obtain the relationship between the capacitor Cx under test, the known capacitors Cs, n, m and C1 as follows:

$$Cx = \frac{m}{n}Cs - C1 \quad (16)$$

Consequently, the capacitance evaluation circuit of this embodiment can evaluate the capacitance and the capacitance variation of the capacitor Cx under test according to the values m and n and the capacitances of the known capacitors Cs and C1.

In FIG. 4, Tclk represents the clock signal cycle, and (i-0.5) Tclk and (i) Tclk respectively represent the $(i-0.5)^{th}$ clock cycle and the $(i)^{th}$ clock cycle. When the clock signal ph2 is enabled, the voltage Vx is sampled. The sampled result influences the output voltage vout of the operation amplifier 310. When the clock signal ph2 is enabled, the voltage Vx is increased and the charge variation (Vx-V2)*C1 is coupled to the node nr, while the bias circuit 390 also couples the charge variation (V2-V1)C1 to the node nr. That is, the coupled charge variation of the node nr is (Vx-V1)*C1 after a complete clock cycle time. Because V1>Vx, the charge variation of the node nr has a negative value, and the voltage Vr is decreased. Consequently, when the clock signal ph2 is enabled, the output voltage vout has the positive integration effect (i.e., is increased) to keep the charges at the node nr conserved, as shown at the timing points 410 and 420 of FIG. 4. The timing point 410 represents the sampling to the voltage Vx, and the timing point 420 represents that the output voltage vout is increased (its voltage variation is $\Delta vout(+)$).

When the output voltage vout of the operation amplifier 310 is higher than the threshold value (0V), the output signal C_OUT of the comparator 320 is changed to 1, as shown at the timing point 430. Because the output signal C_OUT of the comparator 320 is changed to 1, the latched output signal D1 is also changed to 1, as shown at the timing point 440. Because the output signal D1 is 1 (output signal D1B is 0), the output voltage vout is reduced (its voltage variation is $\Delta vout(-)$) and is smaller than 0, as mentioned hereinabove and shown at the timing point 450.

At the timing point 450, the output voltage vout is smaller than 0. So, the output signal C_OUT of the comparator 320 is transited to 0 and the digital signal D1 is also transited to 0 thereafter so that the output voltage vout is again positively integrated. In this manner, it is possible to obtain the number of clock cycles of the digital signal D1 being 1 and the number of clock cycles of the digital signal D1 being 0, and thus to derive the capacitance of the capacitor Cx.

The capacitance evaluation circuit of the second embodiment may be applied to the capacitive switch, the capacitive touch panel, the capacitive display touch panel, and the like.

When the user is operating the capacitive switch, the capacitance of the internal capacitor Cx under test is changed as the user's operation changes. By using the capacitance evaluation circuit to evaluate the capacitance variation of the capacitor Cx, whether the user has pressed the capacitive switch is known. In addition, when the user is operating the capacitive touch panel or the capacitive display touch panel, the capacitance of its internal capacitor Cx under test is changed as the user presses down the panel. By using the capacitance evaluation circuit to evaluate the capacitance variation of the capacitor Cx, the position pressed by the user is known.

In addition, the sigma-delta ADC has the sample-hold function in the first and second embodiments of the disclosure. Thus, the sample-hold circuit is not needed in the capacitance evaluation circuit according to each of the first and second embodiments of the disclosure. However, the disclosure is not limited thereto. If the ADC used by the capacitance evaluation circuit does not have the sample-hold function, the sample-hold circuit is needed in the capacitance evaluation circuit. The sample-hold circuit transfers the sampled and held result to the ADC after sampling and holding the voltage Vx (or the voltage V1–Vx).

In addition, the operation amplifier is a differential amplifier in the first and second embodiments of the disclosure so that the common noise can be suppressed.

Third Embodiment

Figure 5:
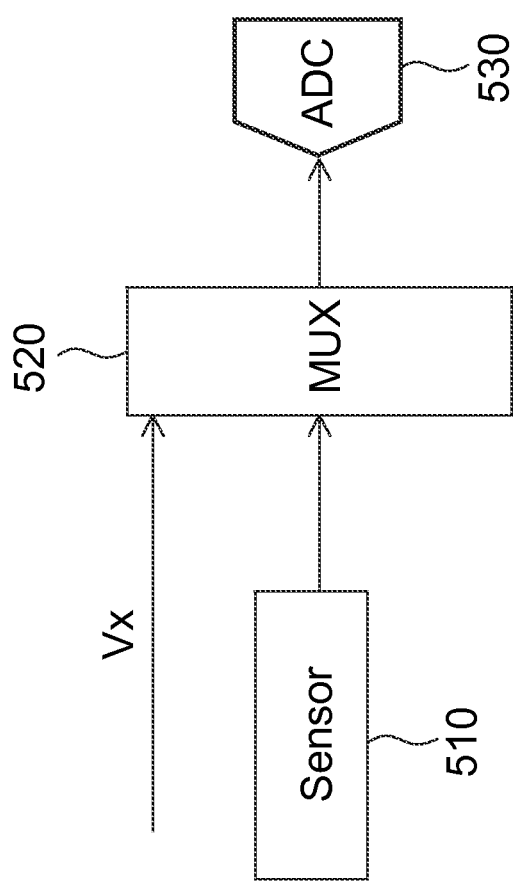
FIG. 5 is a schematic illustration showing function blocks of an electronic device according to a third embodiment of the disclosure.

FIG. 5 is a schematic illustration showing function blocks of an electronic device according to a third embodiment of the disclosure. The electronic device includes, for example but without limitation to, a digital camera having a touch screen. The electronic device includes a sensor 510, a multiplexer 520 and an ADC 530.

The sensor 510 includes, for example but without limitation to, a photosensor, a tilt sensor, a temperature sensor and a humidity sensor. The sensor 510 may sense the external environment and converts the sensed data into the analog voltage. The analog voltage is converted into the digital signal through the ADC 530, and then a post-end processing module determines how to control the electronic device according to the output signal of the ADC.

For example, the sensor 510 includes the photosensor. If the photosensor senses the external light source being dark, the post-end processing module may make the electronic device enter a low power consumption mode. However, when the photosensor senses the external light source being bright, the output voltage of the photosensor is changed. Therefore, the post-end processing module can make the electronic device enter a normal operation mode.

Also, for example, the sensor 510 includes the tilt sensor. If the tilt sensor senses the electronic device being tilted/rotated by a certain angle (for example, the user tilts/rotates the electronic device by 90 degrees), the voltage outputted from the tilt sensor is changed, and the post-end processing module can make the screen of the electronic device display a frame in conjunction with the tilted/rotated angle. Thus, the user can watch the frame displayed on the screen conveniently.

Also, for example, the sensor 510 includes the temperature sensor or the humidity sensor. The temperature sensor or the humidity sensor can sense the external environment to obtain a sensed result, and the post-end processing module can optimize the adjustment of the electronic device.

It is also possible to add other sensors to the electronic device according to the requirement. Consequently, the electronic device has the advantage of smart operations.

The multiplexer 520 selects one of the signals, outputted from the voltage Vx or sensor, and outputs the selected signal to the ADC 530.

The ADC 530 may be the same as or similar to the ADC in the first embodiment or the second embodiment, so detailed descriptions thereof will be omitted. In the third embodiment, Vx is the voltage of the capacitor Cx under test in the first or second embodiment, and may be used to detect the position touched by the user. In the third embodiment of the disclosure, the electronic device has the advantage of the reduced circuit area because the touch screen and the sensor share the same ADC.

In addition, the internal elements of the capacitance evaluation circuit in the first embodiment or the second embodiment may be added to the electronic device of the third embodiment according to the requirement without departing from the scope of the disclosure.

While the disclosure has been described by way of examples and in terms of preferred embodiments, it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electronic device, comprising:
   a capacitor under test, outputting a voltage under test;
   a sensor, outputting a sensing signal;
   a multiplexer, coupled to the capacitor under test and the sensor, outputting one of the voltage under test and the sensing signal;
   an analog-to-digital converter (ADC), coupled to the multiplexer, converting one of the voltage under test and the sensing signal into a digital output signal, which represents one of a capacitance of the capacitor under test and a capacitance variation of the capacitor under test, and a sensed result of the sensor; and
   a touch screen, wherein the capacitor under test is disposed within the touch screen;
   wherein:
   the capacitor under test is inside a capacitance evaluation circuit;
   the capacitance evaluation circuit further comprises:
   a processing circuit, coupled to the ADC, for detecting the capacitance of the capacitor under test and the capacitance variation of the capacitor under test according to the digital output signal of the ADC and a parameter of the ADC;
   the parameter of the ADC comprises a resolution and a full scale of the ADC; and
   the processing circuit further detects the capacitance of the capacitor under test and the capacitance variation of the capacitor under test according to a voltage value of a first voltage source of the capacitance evaluation circuit, a voltage value of a second voltage source of the capacitance evaluation circuit, a capacitance of a known capacitor of the capacitance evaluation circuit, the resolution of the ADC, the full scale of the ADC and the digital signal of the ADC.

2. The electronic device according to claim 1, wherein the ADC comprises:
   a switch-sample-capacitor circuit having a first input terminal and an output terminal, wherein the first input terminal of the switch-sample-capacitor circuit is coupled to the capacitor under test of the capacitance evaluation circuit, and the switch-sample-capacitor circuit is controlled by a first clock signal and a second clock signal to sample a voltage of the capacitor under test of the capacitance evaluation circuit;

an operation amplifier having a first input terminal coupled to the output terminal of the switch-sample-capacitor circuit and further having a second input terminal, a first output terminal and a second output terminal;

a comparator having a first input terminal coupled to the first output terminal of the operation amplifier, a second input terminal coupled to the second output terminal of the operation amplifier, and an output terminal for outputting a comparator digital signal;

a latch, receiving the comparator digital signal outputted from the comparator, wherein the latch outputs the comparator digital signal as a latch digital signal under triggering of the first clock signal;

an inverter, inverting the latch digital signal;

a counter, counting the latch digital signal to generate the digital signal; and a switch-capacitor circuit coupled to the second input terminal of the operation amplifier and controlled by the first clock signal, the second clock signal, the latch digital signal and an inverted signal of the latch digital signal.

* * * * *